(12) United States Patent
Horii et al.

(10) Patent No.: US 12,153,345 B2
(45) Date of Patent: Nov. 26, 2024

(54) PHOTOSENSITIVE RESIN COMPOSITION

(71) Applicant: SUMITOMO BAKELITE CO., LTD., Tokyo (JP)

(72) Inventors: Makoto Horii, Tokyo (JP); Sakiko Suzuki, Tokyo (JP); Ryuji Hirosawa, Tokyo (JP); Wataru Takada, Tokyo (JP)

(73) Assignee: SUMITOMO BAKELITE CO., LTD., Tokyo (JP)

( * ) Notice: Subject to any disclaimer, the term of this patent is extended or adjusted under 35 U.S.C. 154(b) by 0 days.

(21) Appl. No.: 18/276,217

(22) PCT Filed: Feb. 8, 2022

(86) PCT No.: PCT/JP2022/004906
§ 371 (c)(1),
(2) Date: Aug. 7, 2023

(87) PCT Pub. No.: WO2022/172913
PCT Pub. Date: Aug. 18, 2022

(65) Prior Publication Data
US 2024/0045326 A1 Feb. 8, 2024

(30) Foreign Application Priority Data
Feb. 12, 2021 (JP) .................................. 2021-020511

(51) Int. Cl.
*G03F 7/004* (2006.01)

(52) U.S. Cl.
CPC ............ *G03F 7/004* (2013.01); *G03F 7/0045* (2013.01); *G03F 7/0048* (2013.01)

(58) Field of Classification Search
None
See application file for complete search history.

(56) References Cited

U.S. PATENT DOCUMENTS

2023/0096472 A1 * 3/2023 Hirosawa ............... C08G 69/28
528/324

FOREIGN PATENT DOCUMENTS

| JP | 2015-232688 A | 12/2015 |
| JP | 2017-37129 A | 2/2017 |
| WO | WO 2014/115233 A1 | 7/2014 |
| WO | WO 2018/066395 A1 | 4/2018 |
| WO | WO 2021/167077 | * 8/2021 |

OTHER PUBLICATIONS

Pyruvate—Definition and Examples—Biology Online Dictionary, available online at https://www.biologyonline.com/dictionary/pyruvate, date unknown.*
International Preliminary Report on Patentability and English translation of the Written Opinion of the International Searching Authority dated Aug. 24, 2023 for Application No. PCT/JP2022/004906.
International Search Report (PCT/ISA/210) issued in PCT/JP2022/004906, dated May 10, 2022.
Written Opinion of the International Searching Authority (PCT/ISA/237) issued in PCT/JP2022/004906, dated May 10, 2022.

* cited by examiner

*Primary Examiner* — Anca Eoff
(74) *Attorney, Agent, or Firm* — Birch, Stewart, Kolasch & Birch, LLP

(57) ABSTRACT

A photosensitive resin composition including an alkali-soluble resin, a photoacid generator, a first organic solvent, and a second organic solvent different from the first organic solvent, in which the alkali-soluble resin includes at least one selected from a polyamide resin, a polyimide resin, and precursors thereof, the second organic solvent includes a heterocyclic compound having a carbonyl group (provided that N-methyl-2-pyrrolidone is excluded), and the amount of the second organic solvent is 0.001% by mass or more and 4.0% by mass or less with respect to the entire photosensitive resin composition.

1 Claim, 1 Drawing Sheet

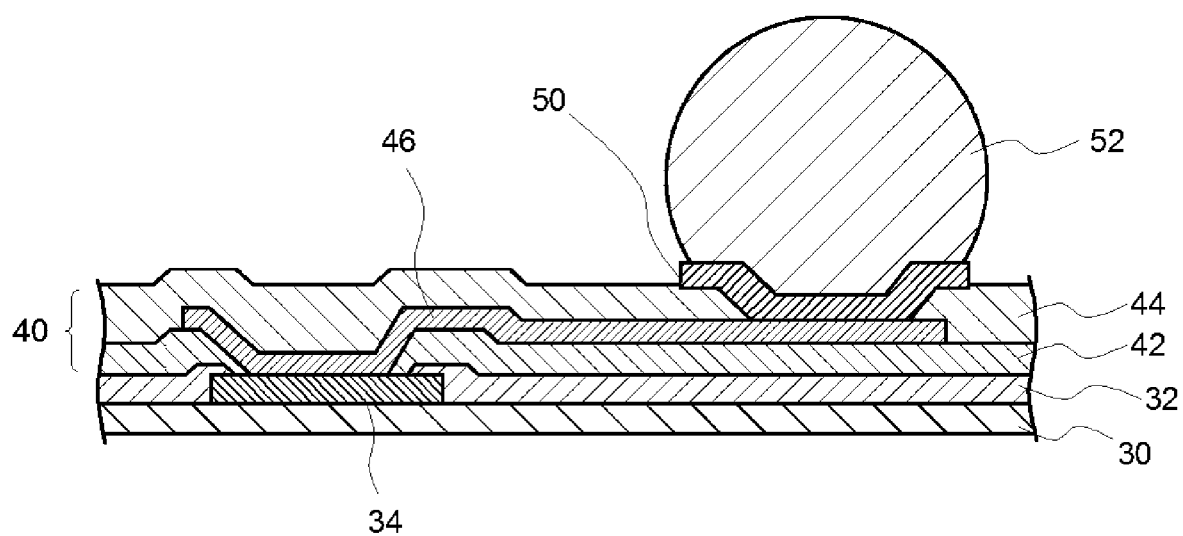

PHOTOSENSITIVE RESIN COMPOSITION

CROSS-REFERENCE TO RELATED APPLICATIONS

This application is the National Phase of PCT International Application No. PCT/JP2022/004906, filed on Feb. 8, 2022, which claims priority under 35 U.S.C. § 119 (a) to Patent Application No. 2021-020511, filed in Japan on Feb. 12, 2021, all of which are hereby expressly incorporated by reference into the present application.

BACKGROUND OF THE INVENTION

Field of the Invention

In the related art, a polyamide resin having excellent heat resistance, electrical characteristics, and mechanical characteristics has been used as a surface protection film or an interlayer insulating film of a semiconductor element. Since such a polyamide resin is subjected to a pattern forming step to be used as a protection film or an interlayer insulating film of a semiconductor element, the polyamide resin is dissolved in an organic solvent, blended with a photosensitive agent, and formed into a varnish-like photosensitive resin composition.

In this regard, the technique disclosed in Patent Document 1 is known. In Patent Document 1, a technique is disclosed for obtaining a photosensitive resin composition including a polyimide precursor or polybenzoxazole precursor and a polar solvent having a specific structure, which is a resin composition that is not gelled with a change in time and has improved sensitivity and mechanical characteristics by adjusting a content of N-methyl-2-pyrrolidone in the photosensitive resin composition to 0.1% by mass or less.

DESCRIPTION OF RELATED ART

Patent Document

[Patent Document 1] International Publication No. WO 2014/115233

BRIEF SUMMARY OF THE INVENTION

Technical Problem

In Patent Document 1, from the viewpoint of reducing an environmental load, an appropriate solvent and the like are selected so that the content of N-methyl-2-pyrrolidone in the resin composition can be reduced.

However, in a stage of manufacturing a resin described as Synthesis Example 1 and the like of Patent Document 1, an operation in which N-methyl-2-pyrrolidone is used as a so-called synthetic solvent, and the organic layer is washed to reduce the amount of N-methyl-2-pyrrolidone after a reaction is conducted. Such an operation makes the process complicated, and in a case where scale-up is carried out, there is a concern that N-methyl-2-pyrrolidone may remain.

In view of such circumstances, an object of the present invention is to provide a photosensitive resin composition in which a content of N-methyl-2-pyrrolidone having a high environmental impact is reduced.

Solution to Problem

According to the present invention, there is provided a photosensitive resin composition including:
an alkali-soluble resin,
a photoacid generator,
a first organic solvent, and
a second organic solvent different from the first organic solvent,
in which the alkali-soluble resin includes at least one selected from a polyamide resin, a polyimide resin, and precursors thereof,
the second organic solvent includes a heterocyclic compound having a carbonyl group (provided that N-methyl-2-pyrrolidone is excluded), and
an amount of the second organic solvent is 0.001% by mass or more and 4.0% by mass or less with respect to the entire photosensitive resin composition.

Advantageous Effects of Invention

According to the present invention,
there is provided a photosensitive resin composition, in which the content of N-methyl-2-pyrrolidone (NMP), having a high environmental impact, is reduced.

BRIEF DESCRIPTION OF THE DRAWINGS

The FIGURE is a cross-sectional view showing an example of an electronic device provided with a resin film produced from the photosensitive resin composition of the present embodiment as a permanent film.

DETAILED DESCRIPTION OF THE INVENTION

Hereinafter, embodiments of the present invention will be described with reference to drawings. Furthermore, in all drawings, the same constituents will be marked with the same reference numerals, and the description thereof will not be repeated. In addition, in the present specification, "to" means "equal to or more than what precedes to and equal to or less than what follows to" unless otherwise specified.

[Photosensitive Resin Composition]

The photosensitive resin composition according to the present embodiment includes an alkali-soluble resin, a photoacid generator, a first organic solvent, and a second organic solvent different from the first organic solvent. In the photosensitive resin composition of the present embodiment, the alkali-soluble resin includes at least one selected from a polyamide resin, a polyimide resin, and precursors thereof. In addition, in the photosensitive resin composition of the present embodiment, the second organic solvent includes a heterocyclic compound having a carbonyl group (provided that N-methyl-2-pyrrolidone is provided), and the amount of the second organic solvent is 0.001% by mass or more and 4.0% by mass or less with respect to the entire photosensitive resin composition.

In the photosensitive resin composition of the present embodiment, the first organic solvent is a main solvent to be used for providing the photosensitive resin composition as a varnish having a desired viscosity by dissolving or dispersing each component of the photosensitive resin composition. In the photosensitive resin composition of the present embodiment, the second organic solvent is a synthetic solvent that is used in the production and/or purification of the alkali-soluble resin to be blended in the photosensitive resin composition, and is a solvent that inevitably remains in an alkali-soluble resin used. In the photosensitive resin composition of the present embodiment, the amount of the second organic solvent is 0.001% by mass or more and 4.0% by mass or less with respect to the entire photosensitive resin composition. The photosensitive resin composition of the present embodiment does not include N-methyl-2-pyrrolidone as the second organic solvent. This can be accomplished by using an alkali-soluble resin that does not use N-methyl-2-pyrrolidone as a synthesis solvent. Furthermore, in the present embodiment, the alkali-soluble resin includes a heterocyclic compound having a carbonyl group other than N-methyl-2-pyrrolidone as an inevitable synthetic solvent. That is, the alkali-soluble resin used in the present embodiment is produced using a heterocyclic compound having a carbonyl group other than N-methyl-2-pyrrolidone as the synthesis solvent. Thus, the photosensitive resin composition of the present embodiment does not include N-methyl-2-pyrrolidone, whereby a load on the environment is reduced. Hereinafter, each component used in the photosensitive resin composition of the present embodiment will be described.

(Alkali-Soluble Resin)

The alkali-soluble resin used in the photosensitive resin composition of the present embodiment is a polyamide resin, a polyimide resin, or a precursor thereof. More specifically, the alkali-soluble resin is a resin having a structure represented by General Formula (1).

[Chem. 1]

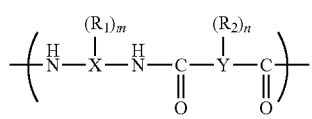
(1)

In General Formula (1), X and Y are each an organic group. $R_1$ is a hydroxyl group, —O—$R_3$, an alkyl group, an acyloxy group, or a cycloalkyl group, and in a case where the repeating unit has a plurality of $R_1$'s, the plurality of $R_1$'s may be the same as or different from each other. $R_2$ is a hydroxyl group, a carboxyl group, —O—$R_3$, or —COO—$R_3$, and in a case where the repeating unit has a plurality of $R_2$'s, the plurality of $R_2$'s may be the same as or different from each other. $R_3$ in $R_1$ and $R_2$ is an organic group having 1 to 15 carbon atoms.

In a case where there is no hydroxyl group as $R_1$, at least one of $R_2$'s is a carboxyl group. In a case where there is no carboxyl group as $R_2$, at least one of $R_1$'s is a hydroxyl group. m is an integer of 0 to 8, and n is an integer of 0 to 8. Examples of organic groups having 1 to 15 carbon atoms as $R_3$ include a formyl group, a methyl group, an ethyl group, a propyl group, an isopropyl group, a tertiary butyl group, a tertiary butoxycarbonyl group, a phenyl group, a benzyl group, a tetrahydrofuranyl group, and a tetrahydropyranyl group.

The organic group as X in General Formula (1) is not particularly limited, but examples thereof include an aromatic group including a structure such as a benzene ring, a naphthalene ring, and a bisphenol structure; a heterocyclic organic group including a structure such as a pyrrole ring and a furan ring; and a siloxane group. More specifically, an organic group represented by Formula (12) is preferable. As necessary, one kind of each of these organic groups may be used, or two or more kinds of these organic groups may be used in combination.

[Chem. 2]

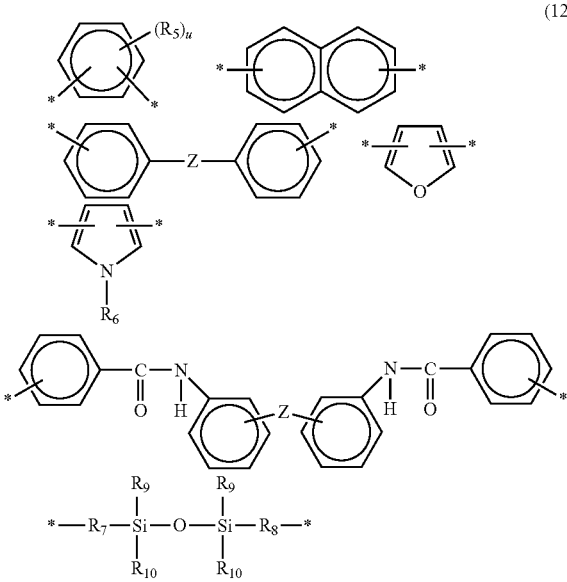
(12)

In Formula (12), * represents a position bonded to the NH group in General Formula (1). Z is an alkylene group, a substituted alkylene group, —O—$C_6H_4$—O—, —O—, —S—, —$SO_2$—, —C(=O)—, —NHC(=O)—, or a single bond. $R_5$'s each represent one selected from an alkyl group, an alkyl ester group, and a halogen atom, and may be the same as or different from each other. $R_6$ represents one selected from a hydrogen atom, an alkyl group, an alkyl ester group, and a halogen atom. u is an integer of 0 to 4. $R_7$ to $R_{10}$ are each a monovalent or divalent organic group.

Furthermore, in the Formula (12), the substituent $R_1$ of X in General Formula (1) is not shown.

Among the groups represented by Formula (12), for example, the groups represented by Formula (13) (some of these groups have $R_1$ in General Formula (1)) are particularly preferable.

[Chem. 3]

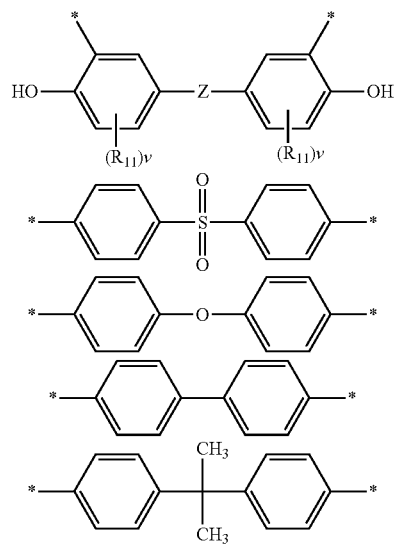
(13)

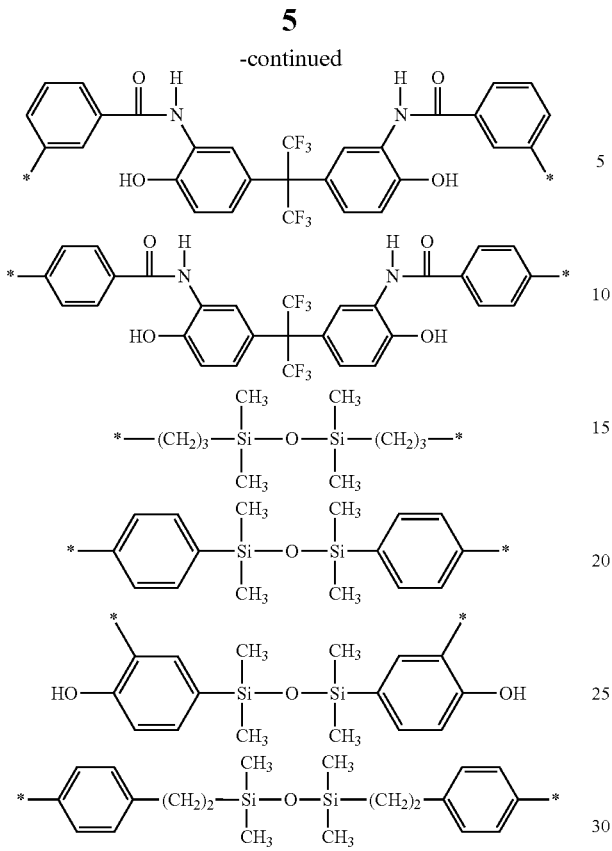

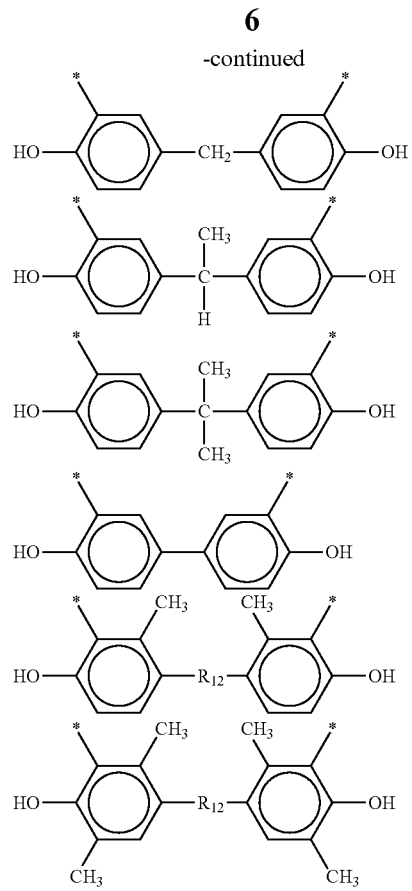

In Formula (13), * represents a position bonded to the NH group in General Formula (1). In the formula, Z is an alkylene group, a substituted alkylene group, —O—, —S—, —SO$_2$—, —C(=O)—, —NHC(=O)—, —CH$_3$—, —C(CH$_3$)H—, —C(CH$_3$)$_2$—, —C(CF$_3$)$_2$—, or a single bond. R$_{11}$ is one selected from an alkyl group, an alkoxy group, an acyloxy group, and a cycloalkyl group, and in a case where there is a plurality of R$_{11}$'s, the plurality of R$_{11}$'s may be the same as or different from each other. v is an integer of 0 or more and 3 or less.

Among the groups represented by Formula (13), for example, the groups represented by Formula (14) (some of these groups have R$_1$ in General Formula (1)) are particularly preferable.

[Chem. 4]

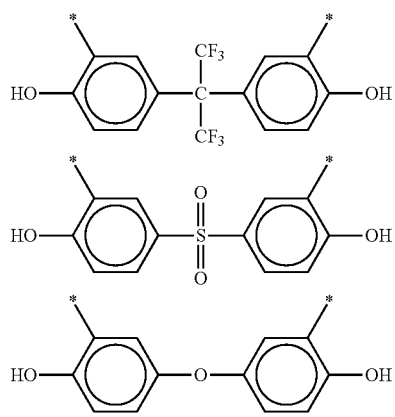

(14)

In Formula (14), * represents a position bonded to the NH group in General Formula (1). R$_{12}$ is an organic group selected from an alkylene group, a substituted alkylene group, —O—, —S—, —SO$_2$—, —C(=O)—, —NHC (=O)—, —C(CF$_3$)$_2$—, and a single bond.

Specific examples of the alkylene group and the substituted alkylene group as Z in Formulae (12) and (13), and R$_{12}$ in Formula (14) include —CH$_2$—, —CH(CH$_3$)—, —C(CH$_3$)$_2$—, —CH(CH$_2$CH$_3$)—, —C(CH$_3$)(CH$_2$CH$_3$)—, —C(CH$_2$CH$_3$)(CH$_2$CH$_3$)—, —CH(CH$_2$CH$_2$CH$_3$)—, —C(CH$_3$)(CH$_2$CH$_2$CH$_3$)—, —CH(CH(CH$_3$)$_2$)—, —C(CH$_3$)(CH(CH$_3$)$_2$)—, —CH(CH$_2$CH$_2$CH$_2$CH$_3$)—, —C(CH$_3$)(CH$_2$CH$_2$CH$_2$CH$_3$)—, —CH(CH$_2$CH(CH$_3$)$_2$)—, —C(CH$_3$)(CH$_2$CH(CH$_3$)$_2$)—, —CH(CH$_2$CH$_2$CH$_2$CH$_2$CH$_3$)—, —C(CH$_3$)(CH$_2$CH$_2$CH$_2$CH$_2$CH$_3$)—, —CH(CH$_2$CH$_2$CH$_2$CH$_2$CH$_2$CH$_3$)—, and —C(CH$_3$)(CH$_2$CH$_2$CH$_2$CH$_2$CH$_2$CH$_3$)—. Among these, —CH$_2$—, —CH(CH$_3$)—, and —C(CH$_3$)$_2$— are preferable since these groups exhibit a sufficient solubility not only in an aqueous alkali solution but also in a solvent and make it possible to obtain a more well-balanced resin film.

In addition, Y in General Formula (1) is an organic group, and examples of the organic group are the same as those of X described above. Examples of the organic group include an aromatic group including a structure such as a benzene ring, a naphthalene ring, or a bisphenol structure; a heterocyclic organic group including a structure such as a pyrrole ring, a pyridine ring, or a furan ring; and a siloxane group. More specifically, preferred examples of the organic group include an organic group represented by Formula (15). These organic groups may be used alone or in combination of two or more kinds thereof.

[Chem. 5]

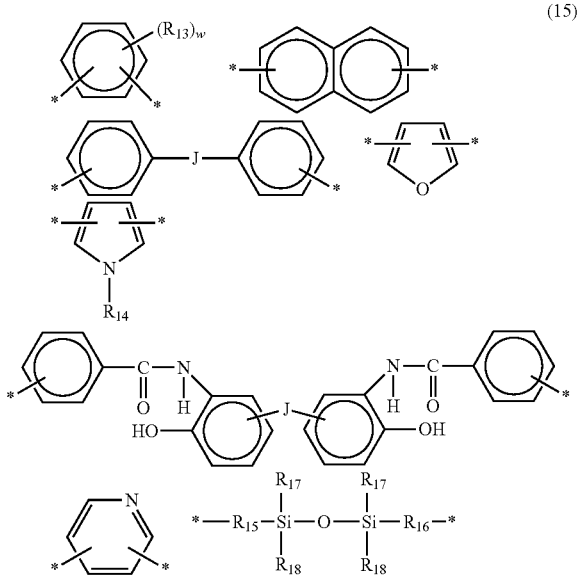

(15)

In Formula (15), * represents a position bonded to the C=O group in General Formula (1). J is —CH$_2$—, —C(CH$_3$)$_2$—, —O—, —S—, —SO$_2$—, —C(=O)—, —NHC(=O)—, —C(CF$_3$)$_2$—, or a single bond. R$_{13}$'s each represent one selected from an alkyl group, an alkyl ester group, an alkyl ether group, a benzyl ether group, and a halogen atom, and may be the same as or different from each other. R$_{14}$ represents one selected from a hydrogen atom, an alkyl group, an alkyl ester group, and a halogen atom. w is an integer of 0 or more and 2 or less. R$_{15}$ to R$_{18}$ are each a monovalent or divalent organic group.

Furthermore, the substituent R$_2$ of Y in General Formula (1) is not shown in Formula (15).

Among the groups represented by Formula (15), particularly preferred examples of the group include groups represented by Formula (16) (some of these groups have R$_2$ in General Formula (1)).

Examples of the structure derived from tetracarboxylic dianhydride in Formula (16) include a structure bonded to the C=O groups in General Formula (1) at meta-positions for both the C=O groups and a structure bonded to the C=O groups in General Formula (1) at para-positions for both the C=O groups, but the structure may include meta-position and para-position as bonding positions.

[Chem. 6]

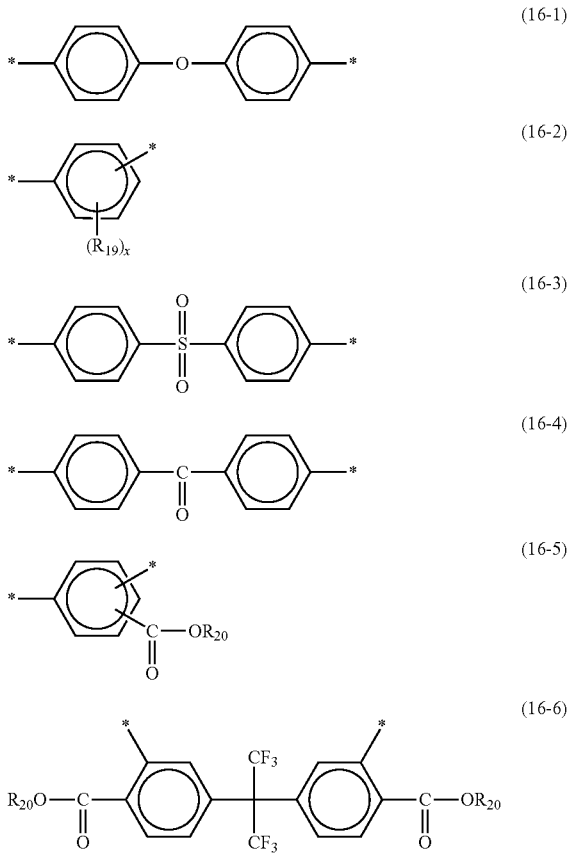

-continued
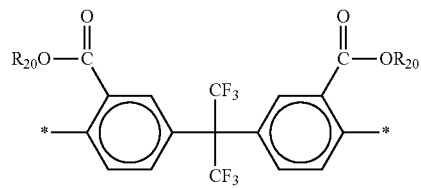
(16-7)
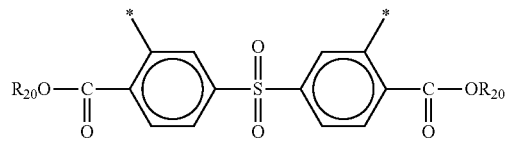
(16-8)
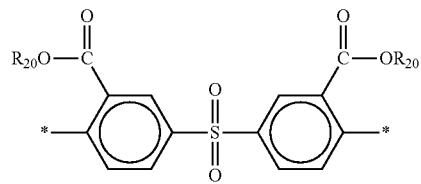
(16-9)
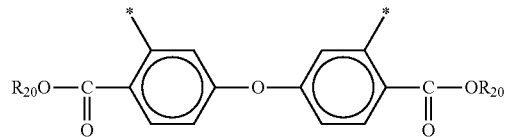
(16-10)
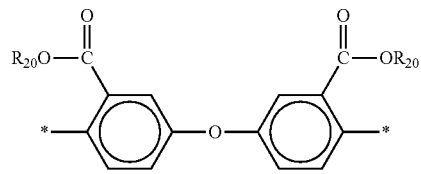
(16-11)
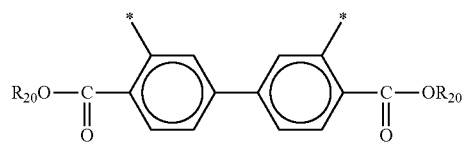
(16-12)
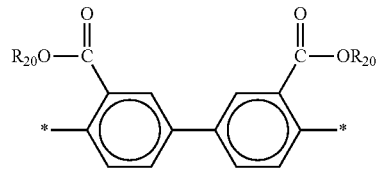
(16-13)
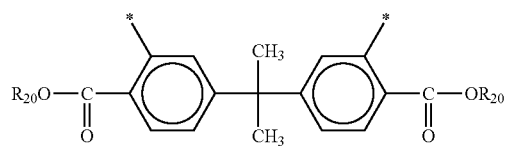
(16-14)
[Chem. 7]
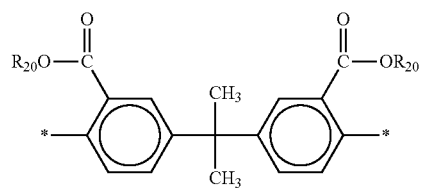
(16-15)

(16-16)
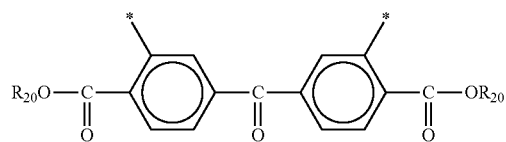
(16-17)
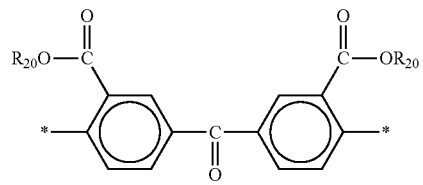
(16-18)
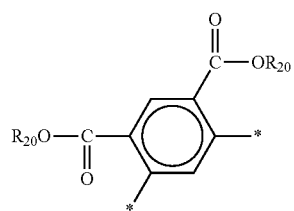
(16-19)
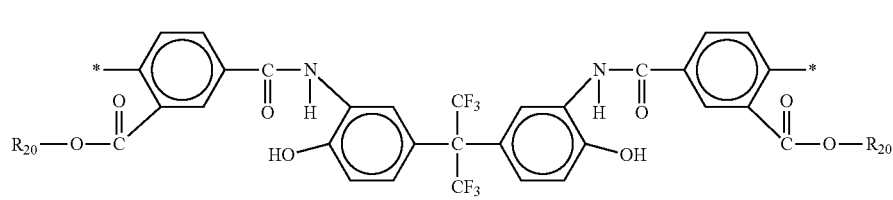
(16-20)
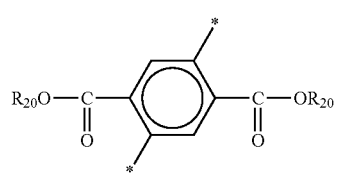
(16-21)
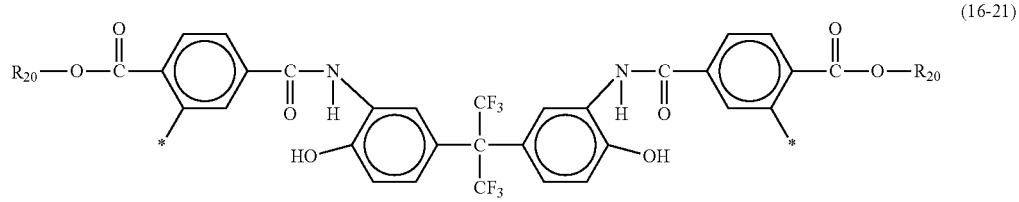
[Chem. 8]
(16-22)
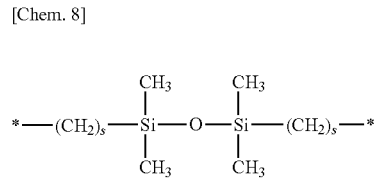
(16-23)
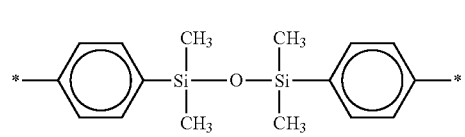
(16-24)
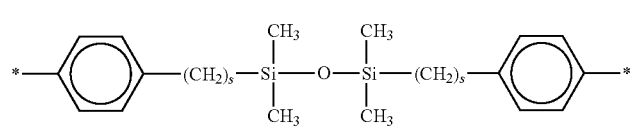

-continued

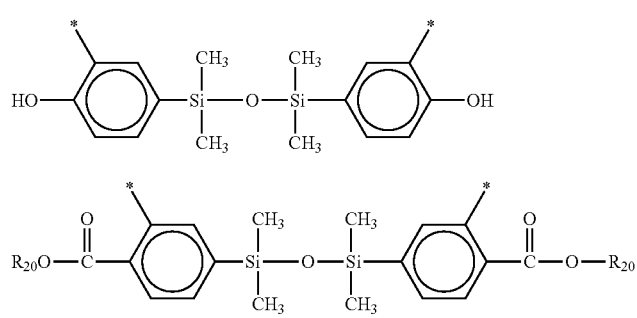

(16-25)

(16-26)

In Formula (16), * represents a position bonded to the C=O group in General Formula (1). $R_{19}$'s each represent one selected from an alkyl group, an alkyl ester group, an alkyl ether group, a benzyl ether group, and a halogen atom, and may be the same as or different from each other. $R_{20}$ represents one selected from a hydrogen atom and an organic group having 1 or more and 15 or less carbon atoms, and may be partially substituted. x is an integer of 0 or more and 2 or less.

The alkali-soluble resin can be obtained by reacting a dicarboxylic acid compound represented by General Formula (2) with a diamine compound represented by General Formula (3). More specifically, the alkali-soluble resin is produced by the following steps 1 and 2.

(Step 1) A step of obtaining an activated carboxylic acid material by activating a carboxylic acid compound represented by General Formula (2).

(Step 2) A step of obtaining a resin represented by Formula (1) by allowing an amine compound represented by General Formula (3) to act on the carboxylic acid activated product obtained in (Step 1). Here, at least one of (Step 1) and (Step 2) is performed in a solvent including a heterocyclic compound having a carbonyl group other than N-methyl-2-pyrrolidone.

[Chem. 9]

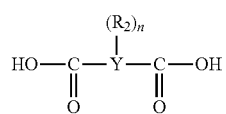

(2)

Y, $R_2$, and n in General Formula (2) each have the same definitions as those in General Formula (1).

[Chem. 10]

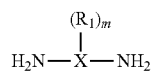

(3)

X, $R_1$, and m in General Formula (3) each have the same definitions as those in General Formula (1).

By performing the above-mentioned step 1 or step 2 in a solvent other than N-methyl-2-pyrrolidone, the residual solvent amount of N-methyl-2-pyrrolidone included in the alkali-soluble resin is reduced. As a result, the environmental load of the photosensitive resin composition including the alkali-soluble resin is reduced. In addition, in particular, by performing the step 2 in a solvent other than N-methyl-2-pyrrolidone, it is possible to accelerate a reduction in an environmental load while promoting an increase in the molecular weight of the resin represented by Formula (1).

At least one of the step 1 and the step 2 is performed in a solvent including a heterocyclic compound having a carbonyl group other than N-methyl-2-pyrrolidone. In the step 1 and the step 2, the same solvent or different solvents may be used, but from the viewpoint of improving a productivity and a reaction efficiency, it is preferable to use the same solvent.

Although a reason why a reaction rate between the dicarboxylic acid compound and the diamine compound is improved in a case where the step 2 is performed in a solvent including a heterocyclic compound having a carbonyl group other than N-methyl-2-pyrrolidone is not clear, it is presumed that the reactivities of monomer molecules are different between the solvent including a heterocyclic compound having a carbonyl group and a solvent including an acyclic compound in the related art. Although the details thereof are still not clear, usually, in a process for synthesizing a photosensitive resin, an acid anhydride as an end-cap compound for completing the reaction is reacted with an amide group at a terminal. On the other hand, it is considered that in a case where the solvent including a heterocyclic compound having a carbonyl group is used, the reaction between the acid anhydride as an end-cap compound and the terminal amide group is appropriately controlled, which improves the reaction rate at the terminal.

In addition, it is considered that in a case where a solvent having a 5-membered heterocycle having a carbonyl group is used, the reactivity among the monomer molecules of the photosensitive resin can also be appropriately controlled as such and the molecular weight can be easily increased. Above all, in a case where the 5-membered heterocycle is selected as the heterocyclic compound having a carbonyl group, such actions and effects can be remarkably obtained.

Since the heterocyclic compound having a carbonyl group has a high solubility for a precursor having an amide bond or other resin components, and has an appropriate polarity, it can make the reaction proceed smoothly in the above-mentioned step 1 or step 2. In addition, in the step 1 and the step 2, the same solvent or different solvents may be used, but from the viewpoint of improving the productivity and the reaction efficiency, it is preferable to use the same solvent.

Examples of the heterocyclic compound having a carbonyl group include a 4-membered ring, a 5-membered ring, a 6-membered ring, and a 7-membered ring, and among these, the 5-membered ring is preferable. These heterocyclic compounds having a carbonyl group may be partially substituted with a hydrocarbon group such as a methyl group, an ethyl group, and a propyl group.

In addition, examples of the heterocyclic compound having a carbonyl group include a compound including a nitrogen atom in addition to the heterocycle (hereinafter, this compound will be referred to as a "carbonyl group-containing heterocyclic compound (i) having a nitrogen atom"). By using the carbonyl group-containing heterocyclic compound (i) having a nitrogen atom in the photosensitive resin composition of the present embodiment, it is possible to obtain a better reactivity, and reduce residues at an opening part by an appropriate solubility.

In addition, the heterocycle in the 5-membered heterocycle having a carbonyl group is preferably one kind or two or more kinds of compounds selected from a furan, a pyrrole, an imidazole, an oxazole, a thiazole, and a pyrazole. From the viewpoint of improving a reaction efficiency, the heterocycle is more preferably one kind or two or more kinds of compounds selected from the pyrrole, the imidazole, the oxazole, the thiazole, and the pyrazole. In addition, different kinds of heterocycles may be combined.

Specifically, examples of a furan having a carbonyl group include γ-butyrolactone (GBL), examples of a pyrrole having a carbonyl group include N-ethyl-2-pyrrolidone (NEP), examples of an imidazole having a carbonyl group include 1,3-dimethyl-2-imidazolidinone (DMI), and examples of an oxazole having a carbonyl group include 3-methyl-2-oxazolidone (MOZ).

Among those, N-ethyl-2-pyrrolidone, 3-methyl-2-oxazolidone, and the like may be mentioned as an example of the carbonyl group-containing heterocyclic compound (i) having a nitrogen atom.

Furthermore, from the viewpoints of increasing the molecular weight of the photosensitive resin and enhancing the reactivity of the photosensitive resin with an end cap, it is preferable to select at least one of γ-butyrolactone and 3-methyl-2-oxazolidone.

In addition, as the solvent of the present embodiment, different kinds of solvents may be used in combination. For example, different kinds of heterocyclic compounds having a carbonyl group may be used in combination, different kinds of carbonyl group-containing heterocyclic compounds (i) having a nitrogen atom may be used in combination, or a solvent other than the heterocyclic compound having a carbonyl group may be used.

That is, as the solvent used in any of the step 1 and the step 2, a compound that is generally used as a solvent can also be used, in addition to the above-mentioned heterocyclic compounds having a carbonyl group.

As the solvent to be used in combination, a known solvent can be used, but from the viewpoint of enhancing the reactivity and obtaining a good solubility, a heterocyclic compound (ii) having no carbonyl group but including a nitrogen atom in addition to the heterocycle and a compound (iii) having a nitrogen atom and a carbonyl group are suitably used.

In addition, from the viewpoint of maintaining a good solubility, for example, the carbonyl group-containing heterocyclic compound (i) having a nitrogen atom and the heterocyclic compound (ii) having no carbonyl group but including a nitrogen atom in addition to the heterocycle may be used in combination, or the carbonyl group-containing heterocyclic compound (i) having a nitrogen atom and the compound (iii) having a nitrogen atom and a carbonyl group may be used in combination.

As a mixing ration in a case where solvents are mixed, the ratio of a compound other than the heterocyclic compound having a carbonyl group to 100 parts by weight of the heterocyclic compound having a carbonyl group of the present embodiment is preferably 1 to 40 parts by weight, and more preferably 1 to 30 parts by weight.

Specific examples of such a compound include 2,6-lutidine, pyruvate, N,N-dimethylacetamide, 3-methoxy-N,N-dimethylpropionamide, dimethylsulfoxide, diethylene glycol dimethyl ether, diethylene glycol diethyl ether, diethylene glycol dibutyl ether, propylene glycol monomethyl ether, dipropylene glycol monomethyl ether, propylene glycol monomethyl ether acetate, methyl lactate, ethyl lactate, butyl lactate, methyl-1,3-butylene glycol acetate, 1,3-butylene glycol-3-monomethyl ether, methyl pyruvate, ethyl pyruvate, and methyl-3-methoxypropionate.

In addition, in the step 1 or the step 2, the above-mentioned heterocyclic compound having a carbonyl group is preferably used as a solvent, but unless the object of the invention is impaired, N-methyl-2-pyrrolidone can be included in the solvent.

The content of N-methyl-2-pyrrolidone is preferably 80% by mass or less, more preferably 60% by mass or less, even more preferably 40% by mass or less, still more preferably 20% by mass or less, and particularly preferably 5% by mass or less with respect to the total amount of solvents. Furthermore, it is particularly preferable that the solvent substantially does not include N-methyl-2-pyrrolidone.

Incidentally, the expression, "substantially does not include", is used with an intention to mean that an aspect in which N-methyl-2-pyrrolidone is intentionally added is excluded, but an aspect in which N-methyl-pyrrolidone is inevitably incorporated in terms of the manufacturing process is accepted.

(Photoacid Generator)

The photosensitive resin composition of the present embodiment includes a photoacid generator. The photoacid generator is a compound that generates light upon exposure to actinic rays (for example, ultraviolet rays, electron beams, and X-rays), and preferably a compound that generates an acid upon irradiation with radiation at a wavelength of 200 to 500 nm, and particularly preferably a wavelength of 350 to 450 nm. Examples of such a photoacid generator include a photosensitive diazoquinone compound, a photosensitive diazonaphthoquinone compound, an onium salt such as a diaryliodonium salt, a triarylsulfonium salt, and a sulfonium borate salt, a 2-nitrobenzyl ester compound, an N-iminosulfonate compound, an imidosulfonate compound, a 2,6-bis(trichloromethyl)-1,3,5-triazine compound, and a dihydropyridine compound. These compounds may be used alone or in combination of two or more kinds thereof.

The photoacid generator is used in an amount of 0.5% by mass or more and 10% by mass or less, and preferably 1% by mass or more and 5% by mass or less with respect to the total solid content of the photosensitive resin composition.

(First Organic Solvent)

The first organic solvent used as the main solvent in the photosensitive resin composition of the present embodiment includes γ-butyrolactone (GBL), γ-valerolactone (GVL), 2,6-lutidine, pyruvate, N,N-dimethylacetamide, 3-methoxy-N,N-dimethylpropionamide, dimethylsulfoxide (DMSO), diethylene glycol dimethyl ether, diethylene glycol diethyl ether, diethylene glycol dibutyl ether, propylene glycol monomethyl ether, dipropylene glycol monomethyl ether (PGME), propylene glycol monomethyl ether acetate, methyl lactate, ethyl lactate, butyl lactate, methyl-1,3-butylene glycol acetate, 1,3-butylene glycol-3-monomethyl ether, methyl pyruvate, ethyl pyruvate, and methyl-3-methoxypropionate. These first organic solvents may be used alone or in combination of two or more kinds thereof.

The content of the first organic solvent in the photosensitive resin composition can be adjusted according to a desired viscosity suitable for the application of the photosensitive resin composition. The content of the first organic solvent is, for example, 10 to 80% by mass, and preferably 20 to 70% by mass with respect to the entire photosensitive resin composition.

(Second Organic Solvent)

The second organic solvent included in the photosensitive resin composition of the present embodiment is a solvent included in the alkali-soluble resin, is specifically a synthetic solvent used in the production and/or the purification of the alkali-soluble resin, and is also a solvent that inevitably remains in the alkali-soluble resin. The synthetic solvent of the alkali-soluble resin can be removed by a known method such as extraction and distillation, but it is difficult to completely remove the synthetic solvent, and in a case where the synthetic solvent is reduced, the handling of the alkali-soluble resin may be deteriorated. In a case where there is little or no synthetic solvent remaining in the alkali-soluble resin, the solubility of the alkali-soluble resin may be deteriorated and the storage stability of the resin composition may be deteriorated. By allowing the synthetic solvent to remain in the alkali-soluble resin, it is possible to offset the above-mentioned disadvantages and an increase in viscosity over time is suppressed, which makes it possible to obtain a photosensitive resin composition having excellent storage stability and handleability. However, in a case where the amount of the synthetic solvent remaining in the alkali-soluble resin is too high, the solubility of the coating film of the photosensitive resin composition in the alkaline developer is increased, and not only the exposed part but also the unexposed part of the coating film are highly dissolved in the alkaline developer. As a result, residues are generated at the bottom of the opening part corresponding to the exposed portion. In the photosensitive resin composition of the present embodiment, the amount of the second organic solvent is 0.001% by mass or more and 4.0% by mass or less with respect to the entire photosensitive resin composition. This makes it possible to obtain a varnish-like photosensitive resin composition without impairing the handleability of the resin composition.

The first organic solvent and the second organic solvent can be used in specific combinations. For example, the photosensitive resin composition can be prepared by appropriately selecting the first organic solvent according to the second organic solvent included in the alkali-soluble resin to be used. Thus, it is possible to adjust the solubility of the alkali-soluble resin, which makes it possible to improve the storage stability and the handleability of the obtained photosensitive resin composition. Examples of a preferred combination of the first organic solvent and the second organic solvent include an aspect in which the first organic solvent is at least one selected from γ-butyrolactone, dipropylene glycol monomethyl ether, and dimethyl sulfoxide, and the second organic solvent is at least one selected from N-ethyl-2-pyrrolidone, 1,3-dimethyl-2-imidazolidinone, and 3-methyl-2-oxazolidone.

[Production of Photosensitive Resin Composition]

The photosensitive resin composition of the present embodiment is obtained by mixing the above-described alkali-soluble resin, photoacid generator, and other components as necessary with the first organic solvent. The photosensitive resin composition of the present embodiment is provided in the form of a varnish or solution in which the components are dissolved or dispersed in the first organic solvent from the viewpoint of the handleability.

[Use of Photosensitive Resin Composition]

A resin film can be produced by curing the photosensitive resin composition of the present embodiment. The obtained resin film can be used as, for example, a permanent film such as a protection film, an interlayer film, or a dam material. Thus, it is possible to improve the durability and the like in an electronic device including the resin film as a permanent film.

Next, an example of an electronic device 100 to which the photosensitive resin composition of the present embodiment has been applied will be described.

The electronic device 100 shown in the FIGURE is, for example, a semiconductor chip. In this case, for example, by mounting the electronic device 100 on a wiring substrate via a bump 52, it is possible to obtain a semiconductor package. The electronic device 100 includes a semiconductor substrate provided with a semiconductor element such as a transistor, and a multilayered wiring layer provided on the semiconductor substrate (not shown in the drawing). The uppermost layer of the multilayered wiring layer is provided with an interlayer insulating film 30 and an uppermost wiring layer 34 provided on the interlayer insulating film 30. The uppermost wiring layer 34 is composed of, for example, Al. A passivation film 32 is provided on the interlayer insulating film 30 and the uppermost wiring layer 34. A part of the passivation film 32 is provided with an opening through which the uppermost wiring layer 34 is exposed.

A rewiring layer 40 is provided on the passivation film 32. The rewiring layer 40 includes an insulating layer 42 provided on the passivation film 32, a rewiring 46 provided on the insulating layer 42, and an insulating layer 44 provided on the insulating layer 42 and the rewiring 46. An opening connected to the uppermost wiring layer 34 is formed in the insulating layer 42. The rewiring 46 is formed on the insulating layer 42 and in the opening provided in the insulating layer 42, and connected to the uppermost wiring layer 34. The insulating layer 44 is provided with an opening connected to the rewiring 46.

In the present embodiment, one or more of the passivation film 32, the insulating layer 42, and the insulating layer 44 can be composed of, for example, a resin film formed by curing the above-mentioned photosensitive resin composition. In this case, for example, by patterning a coating film formed of a photosensitive resin material by means of exposing the coating film to ultraviolet rays and developing the coating film, and then heating and curing the patterned coating film, the passivation film 32 and the insulating layer 42 or the insulating layer 44 are formed.

A bump 52 is formed in the opening provided in the insulating layer 44, for example, via an Under Bump Metallurgy (UBM)) layer 50. The electronic device 100 is connected to a wiring substrate or the like, for example, via the bump 52.

The embodiments of the present invention have been described above, but these are examples of the present invention and various configurations other than the above can be adopted.

EXAMPLES

Hereinafter, the present invention will be described with reference to Examples and Comparative Examples, but the present invention is not limited thereto.

[Synthesis of Alkali-Soluble Resin]

An alkali-soluble resin was synthesized by the method shown below. Solvents used in each of Synthesis Examples are shown below.
- Solvent 1: N-Ethyl-2-pyrrolidone (NEP)
- Solvent 2: 1,3-Dimethyl-2-imidazolidinone (DMI)
- Solvent 3: 3-Methyl-2-oxazolidone (MOZ)
- Solvent 4: N-Methyl-2-pyrrolidone (NMP)
- Solvent 5: γ-Butyrolactone (GBL)

Synthesis Example 1

A precursor having an amide bond was obtained using the solvent 1 (NEP) by the following procedure. The procedure is specifically described below. In addition, the weight-average molecular weight (Mw) and the number-average molecular weight (Mn) of the obtained precursor having an amide bond were measured, and the results thereof are shown in Table 1.

258.2 g (1 mol) of diphenyl ether-4,4'-dicarboxylic acid and 270.3 g (2 mol) of 1-hydroxybenzotriazole were dissolved in the solvent 1 (1,500 g), and then 412.7 g (2 mol) of dicyclohexyl carbodiimide dissolved in the solvent 1 (412 g) was added dropwise thereto over 2 hours at an internal temperature kept at 0° C. to 5° C. After completion of the dropwise addition, the internal temperature was returned to room temperature, and the mixture was further stirred for 12 hours to undergo a reaction. After completion of the reaction, the precipitated dicyclohexyl carbodiurea was removed by filtration, and 4,000 g of pure water was added dropwise to the obtained filtrate to precipitate crystals. The crystals were collected by filtration, washed with 8,000 ml of isopropyl alcohol, and then dried in a vacuum to obtain 467 g of a dicarboxylic acid derivative.

40.87 g (0.083 mol) of the obtained dicarboxylic acid derivative and 36.63 g (0.1 mol) of 2,2-bis(3-amino-4-hydroxyphenyl) hexafluoropropane were put in a four-neck separable flask equipped with a thermometer, a stirrer, a raw material inlet, and a dry nitrogen gas introduction tube, and the solvent 1 (180.8 g) was added thereto to dissolve the components. Then, under a nitrogen stream, the solution was heated to 75° C. using an oil bath and reacted for 12 hours at 75° C. Thereafter, 5.58 g (0.034 mol) of 3,6-endomethylene-1,2,3,6-tetrahydrophthalic anhydride dissolved in the solvent 1 (13.0 g) was added thereto, and the mixture was further stirred for 3 hours and then cooled to room temperature to complete the reaction.

Subsequently, the reaction mixture was filtered and then put in a solution of water and isopropyl alcohol=3 to 1, the precipitate was collected by filtration, washed thoroughly with water, and then dried in a vacuum to obtain a precursor having an amide bond, which has a repeating unit represented by General Formula (A-1) (a resin which serves as polybenzoxazole by undergoing dehydration and ring closing in a case where being heated at 300° C. to 400° C., an alkali-soluble resin 1).

The obtained alkali-soluble resin 1 had a repeating unit (A-1) shown below.

[Chem. 11]

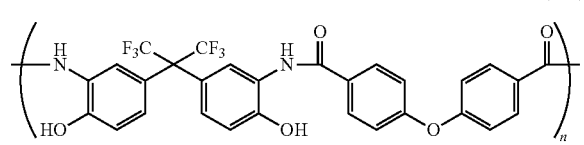

(A-1)

Synthesis Example 2

An alkali-soluble resin 2 was synthesized in the same manner as in Synthesis Example 1, except that the solvent 1 was changed to the solvent 2 (DMI).

Synthesis Example 3

An alkali-soluble resin 3 was synthesized in the same manner as in Synthesis Example 1, except that the solvent 1 was changed to the solvent 3 (MOZ).

Synthesis Example 4

An alkali-soluble resin 4 was synthesized in the same manner as in Synthesis Example 1, except that the solvent 1 was changed to the solvent 4 (NMP).

Synthesis Example 5

An alkali-soluble resin 5 was synthesized in the same manner as in Synthesis Example 1, except that the time for collecting the precipitate by filtration and washing the filtrate with water in Synthesis Example 1 was doubled.

Synthesis Example 6

An alkali-soluble resin 6 was synthesized in the same manner as in Synthesis Example 1, except that the time for filtering the precipitate by filtration and washing the filtrate with water in Synthesis Example 1 was changed to half.

Synthesis Example 7

An alkali-soluble resin 7 was synthesized in the same manner as in Synthesis Example 1, except that the solvent 1 was changed to a mixed solution of the solvent 1 (NEP) and the solvent 2 (DMI) at 1:1 (mass ratio).

Synthesis Example 8

An alkali-soluble resin 8 was synthesized in the same manner as in Synthesis Example 1, except that the solvent 1 was changed to a mixed solution of the solvent 1 (NEP) and the solvent 3 (MOZ) at 1:1 (mass ratio).

Synthesis Example 9

44.9 g (0.16 mol) of 3,3'-diamino-4,4'-dihydroxydiphenyl sulfone, 58.6 g (0.16 mol) of 2,2-bis(3-amino-4-hydroxyphenyl) hexafluoropropane, and the solvent 1 (75.0 g) were put in a four-necked separable flask equipped with a thermometer, a stirrer, a raw material inlet, and a dry nitrogen gas introduction tube, and the solvent 5 (230.5 g) was added thereto and dissolved. After adding 93.1 g (0.30 mol) of 4,4'-oxydiphthalic anhydride together with 120 g of γ-butyrolactone to the mixed solution, the mixture was stirred at room temperature for 60 minutes. Then, using an oil bath, the mixture was stirred at 125° C. for 8 hours to undergo a reaction. After lowering the temperature of the reaction mixture to 60° C., 5.2 g (0.030 mol) of 5-ethynyl-isobenzofuran-1,3-dione was added to the reaction mixture together with 40 g of γ-butyrolactone, and stirred at 80° C. for 3 hours, and then the reaction was completed to synthesize an alkali-soluble resin 9 which is a polyimide precursor.

Synthesis Example 10

An alkali-soluble resin 10 was synthesized in the same manner as in Synthesis Example 1, except that the solvent 1 was not used.

Synthesis Example 11

An alkali-soluble resin 11 was synthesized in the same manner as in Synthesis Example 1, except that the use amount of solvent 1 (NEP) was changed to 6 times the use amount.

[Manufacture of Photosensitive Resin Composition]

Examples 1 to 13 and Comparative Examples 1 to 3

A resin composition was manufactured according to the formulation shown in Table 1. Specifically, the alkali-soluble resin obtained in Synthesis Examples was dissolved in the first organic solvent described in Table 1, a photoacid generator was added thereto, and other components were further added to the mixture to obtain a photosensitive resin composition. The amount of the solvent (second organic solvent) included in the alkali-soluble resin, included in the obtained photosensitive resin composition, is shown in Table 1 as a ratio (% by mass) with respect to the entire photosensitive resin composition. Moreover, each component described in Table 1 is as follows.

(Alkali-Soluble Resin)
- Alkali-soluble resin 1: Alkali-soluble resin 1 synthesized in Synthesis Example 1
- Alkali-soluble resin 2: Alkali-soluble resin 2 synthesized in Synthesis Example 2
- Alkali-soluble resin 3: Alkali-soluble resin 3 synthesized in Synthesis Example 3
- Alkali-soluble resin 4: Alkali-soluble resin 4 synthesized in Synthesis Example 4
- Alkali-soluble resin 5: Alkali-soluble resin 5 synthesized in Synthesis Example 5
- Alkali-soluble resin 6: Alkali-soluble resin 6 synthesized in Synthesis Example 6
- Alkali-soluble resin 7: Alkali-soluble resin 7 synthesized in Synthesis Example 7
- Alkali-soluble resin 8: Alkali-soluble resin 8 synthesized in Synthesis Example 8
- Alkali-soluble resin 9: Alkali-soluble resin 9 synthesized in Synthesis Example 9
- Alkali-soluble resin 10: Alkali-soluble resin 10 synthesized in Synthesis Example 10
- Alkali-soluble resin 11: Alkali-soluble resin 11 synthesized in Synthesis Example 11

(First Organic Solvent)
- GBL: γ-Butyrolactone
- GVL: γ-Valerolactone
- PGME: Dipropylene glycol monomethyl ether
- DMSO: Dimethyl sulfoxide (Photoacid Generator)
- Photoacid generator 1: Compound represented by Formula (B-2) synthesized by the following method (Synthesis of Compound Represented by Formula (B-2))

11.04 g (0.026 mol) of a phenol represented by Formula (B-1), 18.81 g (0.070 mol) of 1,2-naphthoquinone-2-diazide-4-sulfonyl chloride, and 170 g of acetone were put in a four-neck separable flask equipped with a thermometer, a stirrer, a raw material inlet, and a dry nitrogen gas introduction tube, and dissolved by stirring. Then, a mixed solution of 7.78 g (0.077 mol) of triethylamine and 5.5 g of acetone was slowly added dropwise thereto while cooling the flask with a water bath so that the temperature of the reaction solution did not reach 35° C. or higher. After reacting the mixture at room temperature for 3 hours, 1.05 g (0.017 mol) of acetic acid was added thereto and further reacted for 30 minutes. Subsequently, after filtering the reaction mixture, the filtrate was added to a mixed solution of water and acetic acid (990 ml: 10 ml). Then, the precipitate was collected by filtration, washed thoroughly with water, and dried under vacuum. As a result, a compound represented by a structure of Formula (B-2) was obtained.

[Chem. 12]

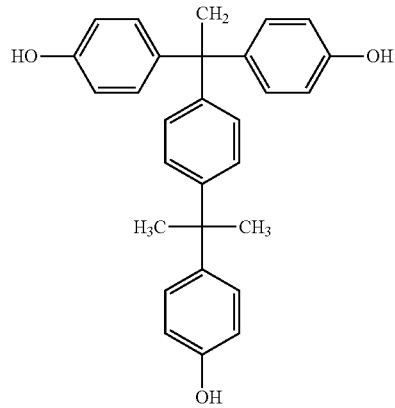

(B-1)

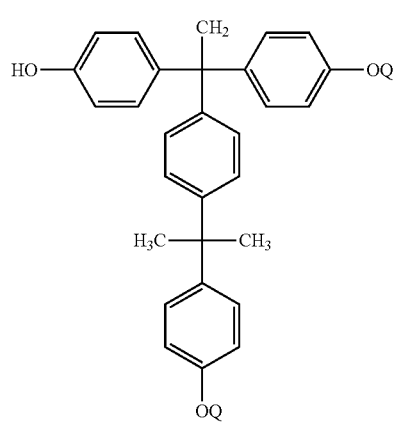

(B-2)

(In the formulae, Q represents a hydrogen atom or

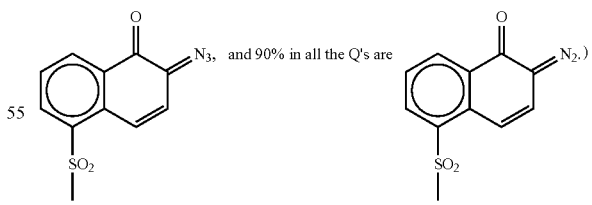

and 90% in all the Q's are (Adhesion Aid)
- Adhesion aid 1: 3-Methacryloxypropyltrimethoxysilane (manufactured by Shin-Etsu Silicone Co., Ltd.)

(Dissolution Accelerator)
- Dissolution accelerator 1: 2,2'-Dihydroxydiphenylmethane

[Evaluation of Performance of Photosensitive Resin Composition]

Examples 1 to 12 and Comparative Examples 1 to 3

Each of the photosensitive resin compositions obtained above was evaluated on the performance in the following items. The evaluation results are shown in Table 1.

(Viscosity Stability)

In a case where the viscosity at 25° C. and the viscosity at 25° C. after storage at 23° C. for 7 days, of the photosensitive resin composition obtained above, are defined as $\eta_0$ and $\eta_1$, respectively, a value of $\eta_0/\eta_1$ was evaluated according to the following standard. The smaller the value of $\eta_1/\eta_0$, the smaller the change in viscosity over time and the better the viscosity stability.

$\eta_1/\eta_0 \leq 5\%$: A
$5\% < \eta_1/\eta_0 \leq 10\%$: B
$10\% < \eta_1/\eta_0 \leq 20\%$: C
$20\% < \eta_1/\eta_0$: D Furthermore, the viscosity of the photosensitive resin composition was measured using a TVE-22H digital viscometer manufactured by Toki Sangyo Co., Ltd.

(Evaluation of Patterning)

Each of the photosensitive resin compositions obtained above was applied onto an 8-inch silicon wafer using a spin coater and then pre-baked on a hot plate at 120° C. for 4 minutes to obtain a coating film having a film thickness of about 8.0 µm. This coating film was irradiated using an i-line stepper through a test mask having a stepwise hole pattern and a line pattern with a size of 1 µm to 100 µm size while varying the exposure amount.

Next, the coating film was subjected to a puddle development twice using a 2.38% aqueous tetramethylammonium hydroxide solution as a developer while adjusting the development time so that a difference between the film thickness after the prebaking and a film thickness after the development was 1.0 µm to dissolve and remove the exposed portion, and then the film was rinsed with pure water for 10 seconds to obtain a photosensitive resin film. In the obtained photosensitive resin film, a bottom of the pattern of a 100 µm-square via hole that had been exposed with a minimum exposure amount for opening the pattern of a 100 µm-square via hole+100 mJ/cm² energy was observed from the top with a microscope, while a degree of residues on the bottom of the pattern was evaluated according to the following standard. A smaller width of the residue indicates the better the patterning properties.

No residue or residues having a width of less than 0.5 µm: A
Residues with a width of 0.5 µm or more and less than 1 µm: B
Residues with a width of 1 µm or more and less than 5 µm: C
Residues with a width of 5 µm or more: D (Film Thickness Uniformity)

Each of the photosensitive resin compositions obtained above was applied onto an 8-inch silicon wafer using a spin coater and then pre-baked on a hot plate at 120° C. for 4 minutes to obtain a coating film having a film thickness of about 8.0 µm. In a case where a notch on the circumference of the 8-inch silicon wafer was set to face forward, the horizontal diameter was defined as an x-axis, the vertical diameter was defined as a y-axis, and the center of the 8-inch silicon wafer was defined as a position with x=0 and y=0, the film thickness of the coating film was measured with a non-contact film thickness meter at intervals of 1 cm from −14 cm to +14 cm on the x-axis and the y-axis, respectively. Thus, a film thickness variation between the maximum film thickness and the minimum film thickness, and an average value of the film thickness after development were obtained. The film thickness variation was evaluated according to the following standard. A smaller film thickness variation value indicates a more uniform film thickness.

Less than 0.1 µm: A
Less than 0.3 µm: B
Less than 0.6 µm: C
0.6 µm or more: D (Curing Shrinkage)

Each of the photosensitive resin compositions obtained above was applied onto an 8-inch silicon wafer using a spin coater and then pre-baked on a hot plate at 120° C. for 4 minutes to obtain a coating film having a film thickness of about 8.0 µm. Next, the coating film was subjected to a puddle development twice using a 2.38% aqueous tetramethylammonium hydroxide solution as a developer while adjusting the development time so that a difference between the film thickness after the prebaking and a film thickness after the development was 1.0 µm, and then the film was rinsed with pure water for 10 seconds. The wafer was put into a heating oven, heated from room temperature to 150° C. at 5° C./min while flowing nitrogen, subjected to a heat treatment at 150° C. for 30 minutes, further heated to 300° C. at 5° C./min, then subjected to a heat treatment at 300° C. for 30 minutes, and then cooled to room temperature. The heated wafer was subjected to the film thickness measurement described for the film thickness uniformity, an average value of the film thickness after the heating was determined, and a cured residual film rate was obtained by dividing an average film thickness after the development by the average film thickness after the heating. The cured residual film rate was evaluated according to the following standard. Since the higher the cured residual film ratio, the smaller the shrinkage after curing, in a case where the cured film thickness is the same, the film thickness at the time of application can be thinner as the cured residual film ratio is higher. Since the thinner the film, the smaller the exposure amount during patterning, a throughput during exposure can be improved.

80% or more: A
75% or more and less than 80%: B
Less than 75%: C

TABLE 1

| | | | Unit | Example 1 | Example 2 | Example 3 | Example 4 | Example 5 | Example 6 | Example 7 | Example 8 |
|---|---|---|---|---|---|---|---|---|---|---|---|
| Formulation | Alkali-soluble resin | Alkali-soluble resin 1 | % by mass | 36 | — | — | — | — | — | — | — |
| | | Alkali-soluble resin 2 | % by mass | — | 36 | — | — | — | — | — | — |
| | | Alkali-soluble resin 3 | % by mass | — | — | 36 | — | — | — | — | — |

TABLE 1-continued

| | | | | | | | | | | |
|---|---|---|---|---|---|---|---|---|---|---|
| | Alkali-soluble resin 4 | % by mass | — | — | — | 35 | — | — | — | — |
| | Alkali-soluble resin 5 | % by mass | — | — | — | — | 36 | — | — | — |
| | Alkali-soluble resin 6 | % by mass | — | — | — | — | — | 36 | — | — |
| | Alkali-soluble resin 7 | % by mass | — | — | — | — | — | — | 36 | — |
| | Alkali-soluble resin 8 | % by mass | — | — | — | — | — | — | — | 36 |
| | Alkali-soluble resin 9 | % by mass | — | — | — | — | — | — | — | — |
| | Alkali-soluble resin 10 | % by mass | — | — | — | — | — | — | — | — |
| | Alkali-soluble resin 11 | % by mass | — | — | — | — | — | — | — | — |
| Photoacid generator | Photoacid generator 1 | % by mass | 5 | 5 | 5 | 5 | 5 | 5 | 5 | 5 |
| First organic solvent | GBL | % by mass | 56 | 56 | 56 | 56 | 56.8 | 54 | 55 | 56.2 |
| | GVL | % by mass | — | — | — | — | — | — | — | — |
| | PGME | % by mass | — | — | — | — | — | — | — | — |
| | DMSO | % by mass | — | — | — | — | — | — | — | — |
| Adhesion aid | Adhesion aid 1 | % by mass | 1 | 1 | 1 | 1 | 1 | 1 | 1 | 1 |
| Dissolution accelerator | Dissolution accelerator 1 | % by mass | 1 | 1 | 1 | 1 | 1 | 1 | 1 | 1 |
| Content of second organic solvent in resin composition | Solvent 1 (NEP) | % by mass | 1 | — | — | — | 0.2 | 3 | 1 | 0.4 |
| | Solvent 2 (DMI) | % by mass | — | 1 | — | — | — | — | 1 | — |
| | Solvent 3 (MOZ) | % by mass | — | — | 1 | — | — | — | — | 0.4 |
| | Solvent 4 (NMP) | % by mass | — | — | — | 1 | — | — | — | — |
| | Solvent 5 (GBL) | % by mass | — | — | — | — | — | — | — | — |
| Evaluation | Viscosity stability | — | A | A | A | A | B | A | A | A |
| | Patterning properties | — | A | A | A | A | A | B | B | A |
| | Film thickness Uniformity | — | B | B | B | B | B | B | B | B |
| | Curing shrinkage | — | A | B | A | A | A | B | A | A |

| | | | Example 9 | Example 10 | Example 11 | Example 12 | Comparative Example 1 | Comparative Example 2 | Comparative Example 3 |
|---|---|---|---|---|---|---|---|---|---|
| Formulation | Alkali-soluble resin | Alkali-soluble resin 1 | — | 36 | — | — | — | — | — |
| | | Alkali-soluble resin 2 | — | — | 36 | — | — | — | — |
| | | Alkali-soluble resin 3 | — | — | — | 36 | — | — | — |
| | | Alkali-soluble resin 4 | — | — | — | — | — | — | — |
| | | Alkali-soluble resin 5 | — | — | — | — | — | — | — |
| | | Alkali-soluble resin 6 | — | — | — | — | — | — | — |
| | | Alkali-soluble resin 7 | — | — | — | — | — | — | — |
| | | Alkali-soluble resin 8 | — | — | — | — | — | — | — |
| | | Alkali-soluble resin 9 | 36 | — | — | — | — | — | — |
| | | Alkali-soluble resin 10 | — | — | — | — | 36 | — | 36 |
| | | Alkali-soluble resin 11 | — | — | — | — | — | 36 | — |
| | Photoacid generator | Photoacid generator 1 | 5 | 5 | 5 | 5 | 5 | 5 | 5 |
| | First organic solvent | GBL | 56 | — | 36 | 51 | 57 | 51 | 56 |
| | | GVL | — | 56 | — | — | — | — | — |
| | | PGME | — | — | 20 | — | — | — | 1 |
| | | DMSO | — | — | — | 5 | — | — | — |
| | Adhesion aid | Adhesion aid 1 | 1 | 1 | 1 | 1 | 1 | 1 | 1 |
| | Dissolution accelerator | Dissolution accelerator 1 | 1 | 1 | 1 | 1 | 1 | 1 | 1 |

TABLE 1-continued

| | | | | | | | | | |
|---|---|---|---|---|---|---|---|---|---|
| | Content of second organic solvent in resin composition | Solvent 1 (NEP) | 0.3 | 1 | — | — | — | 6 | — |
| | | Solvent 2 (DMI) | — | — | 1 | — | — | — | — |
| | | Solvent 3 (MOZ) | — | — | — | 1 | — | — | — |
| | | Solvent 4 (NMP) | — | — | — | — | — | — | — |
| | | Solvent 5 (GBL) | 0.6 | — | — | — | — | — | — |
| Evaluation | Viscosity stability | | A | A | A | A | D | A | D |
| | Patterning properties | | A | A | A | B | A | D | A |
| | Film thickness Uniformity | | B | B | A | A | B | B | B |
| | Curing shrinkage | | A | A | A | A | A | C | A |

All of the photosensitive resin compositions of Examples did not include a solvent with a high environmental load, and thus had a reduced load on the environment. In addition, all of the photosensitive resin compositions of Examples had excellent storage stability and good pattern formability.

This application claims priority based on Japanese Patent Application No. 2021-020511 filed on Feb. 12, 2021, the entire disclosure of which is herein incorporated by reference.

REFERENCE SIGNS LIST 100 electronic device
30 interlayer insulating film
32 passivation film
34 uppermost wiring layer
40 rewiring layer
42 insulating layer
44 insulating layer
46 rewiring
50 UBM layer
52 bump

The invention claimed is:

1. A photosensitive resin composition comprising:
an alkali-soluble resin;
a photoacid generator; and
an organic solvent consisting of a first organic solvent and a second organic solvent different from the first organic solvent;
wherein the alkali-soluble resin comprises a polyamide resin, and the polyamide resin has a repeating unit represented by Formula (1),

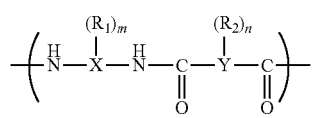

(1)

wherein in Formula (1):
X and Y are each an organic group,
$R_1$ is a hydroxyl group, —O—$R_3$, an alkyl group, an acyloxy group, or a cycloalkyl group, and in a case where the repeating unit has a plurality of $R_1$'s, the plurality of $R_1$'s are the same or different from each other, $R_2$ is a hydroxyl group, a carboxyl group, —O—$R_3$, or —COO—$R_3$, and in a case where the repeating unit has a plurality of $R_2$'s, the plurality of $R_2$'s are the same or different from each other, $R_3$ in each of $R_1$ and $R_2$ is an organic group having 1 to 15 carbon atoms, wherein in a case where there is no hydroxyl group as $R_1$, at least one of the $R_2$'s is a carboxyl group, wherein in a case where there is no carboxyl group as $R_2$, at least one of the $R_1$'s is a hydroxyl group, m is an integer of 0 to 8, and
n is an integer of 0 to 8;

wherein the photoacid generator is at least one selected from a diazoquinone compound, a diazonaphthoquinone compound, an onium salt, a 2-nitrobenzyl ester compound, an N-iminosulfonate compound, an imidosulfonate compound, a 2,6-bis(trichloromethyl)-1,3,5-triazine compound, and a dihydropyridine compound;

wherein an amount of the photoacid generator is 1% by mass or more and 5% by mass or less with respect to a total solid content of the photosensitive resin composition;

wherein the first organic solvent consists of at least one selected from γ-butyrolactone, γ-valerolactone, 2,6-lutidine, pyruvate, N,N-dimethylacetamide, 3-methoxy-N,N-dimethylpropionamide, dimethylsulfoxide, diethylene glycol dimethyl ether, diethylene glycol diethyl ether, diethylene glycol dibutyl ether, propylene glycol monomethyl ether, dipropylene glycol monomethyl ether, propylene glycol monomethyl ether acetate, methyl lactate, ethyl lactate, butyl lactate, methyl-1,3-butylene glycol acetate, 1,3-butylene glycol-3-monomethyl ether, methyl pyruvate, ethyl pyruvate, and methyl-3-methoxypropionate;

wherein an amount of the first organic solvent is 20% by mass or more and 70% by mass or less with respect to an entirety of the photosensitive resin composition;

wherein the second organic solvent consists of at least one selected from N-ethyl-2-pyrrolidone, 1,3-dimethyl-2-imidazolidinone, and 3-methyl-2-oxazolidone; and wherein an amount of the second organic solvent is 0.8% by mass or more and 2.0% by mass or less with respect to an entirety of the photosensitive resin composition.

* * * * *